(12) United States Patent
Albertson et al.

(10) Patent No.: US 7,642,651 B2
(45) Date of Patent: Jan. 5, 2010

(54) MULTI-LAYER INTERCONNECT WITH ISOLATION LAYER

(75) Inventors: Todd Albertson, Boise, ID (US); Darin Miller, Boise, ID (US); Mark Anderson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 11/560,504

(22) Filed: Nov. 16, 2006

(65) Prior Publication Data

US 2007/0069262 A1  Mar. 29, 2007

Related U.S. Application Data

(62) Division of application No. 10/713,845, filed on Nov. 14, 2003, now Pat. No. 7,375,033.

(51) Int. Cl.
*H01L 23/48* (2006.01)
*H01L 23/52* (2006.01)
*H01L 29/40* (2006.01)

(52) U.S. Cl. .............................. 257/758; 257/E23.019
(58) Field of Classification Search ........................ None
See application file for complete search history.

(56) References Cited

U.S. PATENT DOCUMENTS

| | | | |
|---|---|---|---|
| 3,991,231 A | 11/1976 | Trausch | |
| 4,546,534 A | 10/1985 | Nicholas | |
| 4,675,981 A | 6/1987 | Naruke | |
| 5,057,888 A | 10/1991 | Fazan et al. | |
| 5,245,210 A | * 9/1993 | Nishigoori | 257/382 |
| 5,250,457 A | 10/1993 | Dennison | |
| 5,292,677 A | 3/1994 | Dennison | |
| 5,338,700 A | 8/1994 | Dennison et al. | |
| 5,401,681 A | 3/1995 | Dennison et al. | |

(Continued)

FOREIGN PATENT DOCUMENTS

JP        08-167580        6/1996

(Continued)

OTHER PUBLICATIONS

Sakao et al., "A capacitor-over-bit-line (COB) cell with hemispherical-grain storage node for 64Mb DRAMs," IEDM, Dec. 9, 1990-Dec. 12, 1990, pp. 27.3.1-27.3.4, vol. 90, San Francisco.

(Continued)

*Primary Examiner*—W. David Coleman
*Assistant Examiner*—Shaka Scarlett
(74) *Attorney, Agent, or Firm*—Knobbe, Martens, Olson & Bear LLP

(57) ABSTRACT

An integrated circuit interconnect is fabricated by using a mask to form a via in an insulating layer for a conductive plug. After the plug is formed in the via, a thin (e.g., <100 nm) isolation layer is deposited over the resulting structure. An opening is created in the isolation layer by using the same mask at a different radiation exposure level to make the opening more narrow than the underlying plug. A conductive line is then formed which makes electrical contact with the plug through the opening in the isolation layer. By vertically separating and electrically isolating the conductive plug from adjacent conductive lines, the isolation layer advantageously reduces the likelihood of an undesired electrical short occurring between the conductive plug and a nearby conductive line.

21 Claims, 4 Drawing Sheets

U.S. PATENT DOCUMENTS

| | | | |
|---|---|---|---|
| 5,488,011 | A | 1/1996 | Figura et al. |
| 5,554,557 | A | 9/1996 | Koh |
| 5,940,714 | A | 8/1999 | Lee et al. |
| 5,981,149 | A | 11/1999 | Yamaguchi |
| 5,998,257 | A | 12/1999 | Lane et al. |
| 6,046,093 | A | 4/2000 | DeBoer et al. |
| 6,051,369 | A | 4/2000 | Azuma et al. |
| 6,083,803 | A | 7/2000 | Fischer et al. |
| 6,083,831 | A | 7/2000 | Dennison |
| 6,100,137 | A * | 8/2000 | Chen et al. ............. 438/253 |
| 6,174,767 | B1 | 1/2001 | Chi |
| 6,180,530 | B1 * | 1/2001 | Liaw et al. ............. 438/706 |
| 6,184,079 | B1 | 2/2001 | Lee |
| 6,204,143 | B1 | 3/2001 | Roberts et al. |
| 6,221,711 | B1 | 4/2001 | Roberts et al. |
| 6,222,222 | B1 | 4/2001 | DeBoer et al. |
| 6,251,710 | B1 | 6/2001 | Radens et al. |
| 6,258,490 | B1 | 7/2001 | Bula et al. |
| 6,306,769 | B1 | 10/2001 | Subramanian et al. |
| 6,312,985 | B1 * | 11/2001 | Wu et al. ............. 438/253 |
| 6,365,453 | B1 | 4/2002 | Deboer et al. |
| 6,417,065 | B1 | 7/2002 | Wu et al. |
| 6,417,097 | B1 * | 7/2002 | Hwang et al. ............. 438/637 |
| 6,423,591 | B2 * | 7/2002 | Nakamura ............. 438/238 |
| 6,621,110 | B1 * | 9/2003 | Matsuoka et al. ............. 257/296 |
| 6,660,650 | B1 * | 12/2003 | Konecni et al. ............. 438/720 |
| 6,696,359 | B1 * | 2/2004 | Ireland ............. 438/624 |
| 6,709,975 | B2 * | 3/2004 | Mao et al. ............. 438/637 |
| 6,967,499 | B1 * | 11/2005 | Haase et al. ............. 324/766 |
| 7,098,135 | B2 * | 8/2006 | Chung et al. ............. 438/694 |
| 2001/0000242 | A1 * | 4/2001 | Huang ............. 438/106 |

OTHER PUBLICATIONS

Office Action dated May 15, 2008 received for U.S. Appl. No. 11/530150, Mailroom date May 15, 2008.

* cited by examiner

_14_
*FIG. 3A*
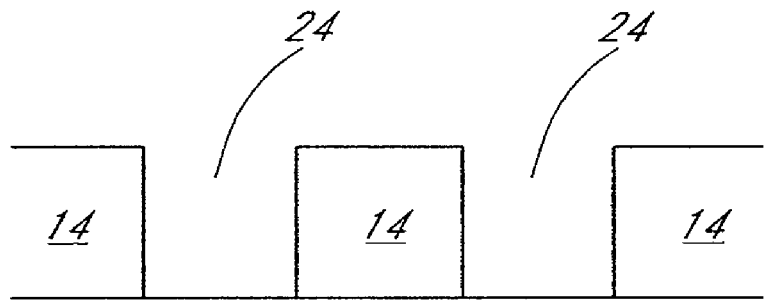
*FIG. 3B*
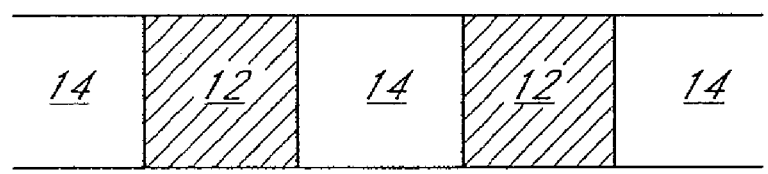
*FIG. 3C*

MULTI-LAYER INTERCONNECT WITH ISOLATION LAYER

CROSS-REFERENCE TO RELATED APPLICATIONS

This application is a divisional of U.S. patent application Ser. No. 10/713,845, filed Nov. 14, 2003, entitled "MULTI-LAYER INTERCONNECT WITH ISOLATION LAYER," the disclosure of which is incorporated herein by reference.

BACKGROUND OF THE INVENTION

1. Field of the Invention

The present invention relates in general to interconnects used in integrated circuits. More specifically, the present invention relates to multi-layer interconnects having an isolation layer.

2. Description of the Related Art

Integrated circuit designers often desire to increase the density of elements within an integrated circuit by reducing the size of the individual elements and reducing the separation distance between neighboring elements. One challenge faced by integrated circuit designers attempting to achieve this goal is that, as individual circuit elements become smaller and are formed closer together, it can become more difficult to form interconnects between the elements without creating electrical shorts within the circuit.

Generally speaking, interconnects are integrated circuit structures that can be used to electrically connect conductive circuit elements in a wide variety of circuits. For example, interconnects can be used in a memory device, such as a dynamic random access memory (DRAM), to electrically connect circuit elements formed at different layers within the memory device.

SUMMARY OF THE INVENTION

In accordance with one aspect of the invention, an integrated circuit is provided with a conductive plug, a conductive line formed over the conductive plug and an isolation layer formed between the conductive plug and the conductive line. The isolation layer includes an opening through which the lower portion of the conductive line extends to make electrical contact with the upper surface of the conductive plug. The opening has a smaller width than that of the conductive plug such that the isolation layer electrically isolates one or more outer regions of the upper surface of the conductive plug from other nearby conductive lines.

In accordance with another aspect of the invention, a system includes an integrated circuit comprising a metal plug, a dielectric layer and a metal line. The dielectric layer has a thickness between about 5 nm and 100 nm, and includes an opening over the metal plug. The metal line includes a lower portion that extends through the opening to make electrical contact with the metal plug.

In accordance with another aspect of the application, a metallization scheme for an integrated circuit includes a plurality of metal plugs at one level and a plurality of metal lines formed above the metal plugs at a second level. The metal lines are vertically separated from the metal plugs by a distance between about 5 nm and 100 nm except at positions directly over the metal plugs.

In accordance with another aspect of the invention, a method is provided for forming an integrated circuit interconnect. An insulating layer is provided as a blanket layer. A first photoresist film is formed over the insulating layer and exposed through a first mask reticle to radiation at a first radiation exposure level. A via is then etched in the insulating layer and a conductive plug formed within the via. An isolation layer is deposited over the insulating layer and the conductive plug. A second photoresist film is formed over this isolation layer, and exposed through the first mask reticle to radiation at a second radiation exposure level. An opening is etched in the isolation layer over a conductive plug, where the opening has a width narrower than that of the conductive plug. A conductive line is then formed over the opening such that the conductive line makes electrical contact with the conductive plug through the opening.

In accordance with another aspect of the invention, a method is provided for forming a conductive bridge between a metal line and a conductive plug. The method includes forming an insulating layer with a thickness less than about 100 nm. An opening is formed within the insulating layer and the opening is filled with metal.

In accordance with another aspect of the invention, a method is provided for forming an integrated circuit element. A first mask is used to form a first via by subjecting a first photoresist film to radiation through the first mask at a first radiation exposure level. The first metal is deposited into the first via. Using the first mask a second time, a second via is formed by subjecting a second photoresist film to radiation through the first mask at a second radiation exposure level. A second metal deposited into this second via.

In accordance with another aspect of the invention, a method is provided for forming a plurality of conductive lines. A plurality of vias are formed in a dielectric layer that has a thickness less than about 100 nm. A conductive material is deposited over the dielectric layer such that the vias are filled with the conductive material and a conductive layer is formed over the dielectric layer and the filled vias. The conductive layer is etched to form a plurality of conductive lines above the dielectric layer and the filled vias.

BRIEF DESCRIPTION OF THE DRAWINGS

These and other features and advantages of the invention will now be described with reference to the drawings of certain preferred embodiments, which are intended to illustrate, and not to limit, the invention.

FIGS. 3A-3H are a series of schematic cross-sections illustrating the formation of a multi-layer interconnect having an isolation layer vertically between metal lines and plugs, in accordance with one embodiment of the present invention.

DETAILED DESCRIPTION OF THE PREFERRED EMBODIMENT

For purposes of illustration, various embodiments of the invention will be described in the context of an integrated circuit metallization scheme having a particular configuration. The details associated with this specific configuration are set forth to illustrate, and not to limit, the invention. The scope of the invention is defined only by the appended claims.

Figure 1A:
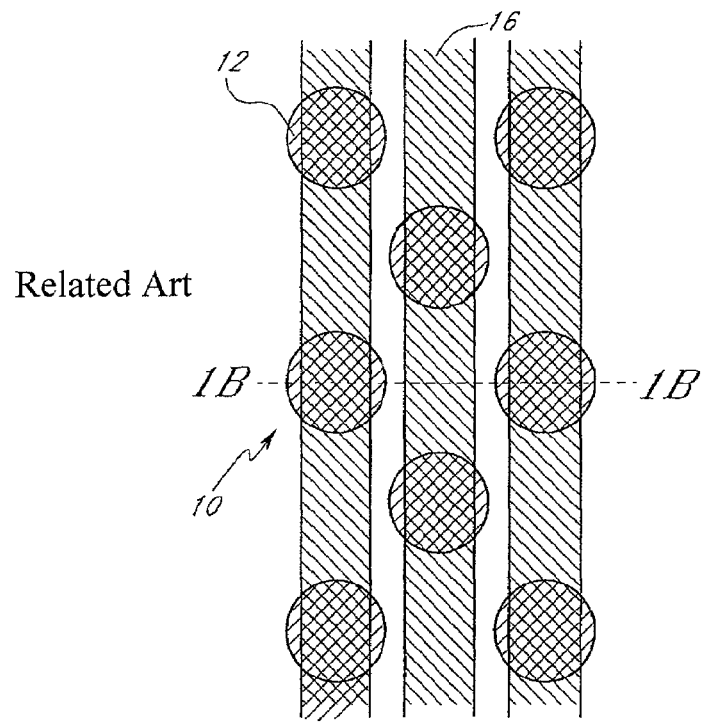
FIGS. 1A and 1B are a top-down schematic plan view and an elevational cross-section, respectively, illustrating a plurality of conventional integrated circuit metal lines and underlying plugs.
Figure 1B:
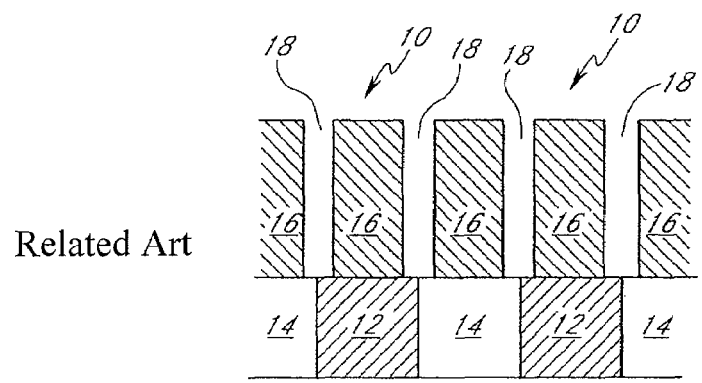

FIG. 1A illustrates a top-down view of a plurality of conventional integrated circuit interconnects 10 formed at the intersections of a plurality of conductive plugs 12 and conductive lines 16. FIG. 1B illustrates a cross-sectional view of the interconnects 10 taken along the line 1B-1B of FIG. 1A. Therefore, in the cross-sectional view of FIG. 1B, the conductive lines 16 run into and out of the page, and each conductive line is coupled to a plurality of conductive plugs 12. In some embodiments, the metallization scheme interconnects memory cells in an array with various external elements, such as power supplies and ground. Those of ordinary skill in the art will understand, however, that the interconnects 10 can be used in a wide variety of integrated circuit contexts.

As illustrated in FIG. 1B, the conductive plugs 12 are preferably formed in an insulating layer 14. The conductive plugs 12, the insulating layer 14, and the conductive lines 16 may comprise any of a wide variety of materials that are known to those of skill in the art. For example, in some embodiments, the conductive plugs 12 comprise tungsten, with titanium and titanium nitride liners for adhesion/barrier purposes, the insulating layer 14 comprises BPSG, and the conductive lines 16 comprise aluminum.

The conductive plugs 12 and the conductive lines 16 can be formed using a variety of processes. For example, in one embodiment, the conductive plugs 12 are formed by depositing the insulating layer 14 as a blanket layer on a substrate (not shown). A plurality of vias for the conductive plugs 12 are then formed in the insulating layer 14 using conventional photolithography and etching techniques. A conductive material is then deposited into the vias and above the insulating layer 14 using any of a variety of well-known deposition processes, such as, for example, chemical vapor deposition (CVD). The conductive material is then etched back to the surface of the insulating layer 14 using any suitable etching process, such as, for example, chemical mechanical polishing or planarization (CMP). The material used to form the conductive lines 16 is then deposited as a blanket layer over the resulting structure using a suitable deposition process, such as, for example, physical vapor deposition (PVD). A series of trenches 18 is then formed using conventional photolithography and etching techniques to pattern the conductive lines 16. In other arrangements, damascene processes are used during metallization, although the methods and structures described herein have particular utility for conventional plug and metal line formation.

In some embodiments, the width of the conductive plugs 12 preferably falls within the range of about 50 nm to about 300 nm, more preferably about 100 to 250 nm. In one example, the plugs have a 230 nm width at the top and 180 nm at the bottom of the plugs 12. The height of the conductive plugs 12 preferably falls within the range of about 500 nm to about 5,000 nm, more preferably about 2,000 nm. In some embodiments, the width of the conductive lines 16 preferably falls within the range of about 30 nm to about 200 nm, more preferably about 50 nm to 150 nm. In one example, the line width is about 110 nm. The height of the conductive lines 16 preferably falls within the range of about 250 nm to about 350 nm, more preferably about 300 nm. In some embodiments, the conductive line is separated from the adjacent conductive line by less than about 110 nm.

As illustrated in FIGS. 1A-1B, although a given conductive line 16 is in contact with a plurality of conductive plugs 12 within a particular row or column of the array, the conductive line 16 is preferably not in contact with the conductive plugs 12 of any adjacent rows or columns. Because the distance between the conductive plugs 12 is often relatively small (e.g., separation between adjacent lines of between about 125 nm to 250 nm), however, it can be difficult to form the trenches 18 such that a given conductive line 16 does not make contact with the conductive plugs 12 in a nearby row or column.

Figure 2:
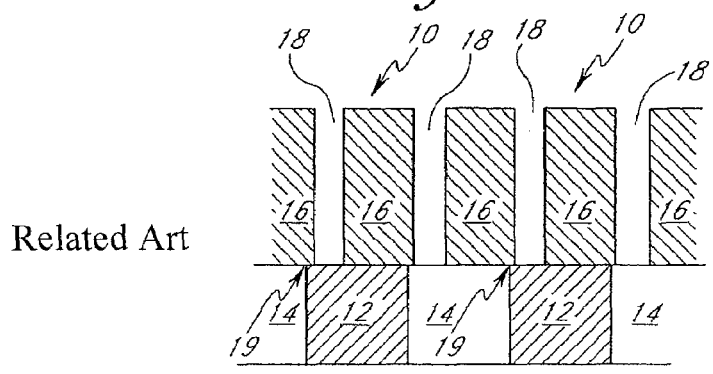
FIG. 2 is a schematic cross-sectional view of conventional integrated circuit metal lines and plugs with electrical shorts caused by mask misalignment.

For example, if the mask used to form the trenches 18 is even slightly misaligned, the conductive lines 16 will shift from their desired positions, as illustrated in FIG. 2. When such a shift occurs, a given conductive line 16 may contact the conductive plugs 12 of a neighboring row or column, as indicated at contact points 19 in FIG. 2. Such contact points 19 cause undesirable electrical shorts to form between the conductive lines 16 and the conductive plugs 12 of an adjacent row or column. Therefore, in a preferred embodiment of the present invention, an additional isolation layer is formed below the conductive lines 16 to reduce the likelihood of electrical shorting between a given conductive line 16 and the conductive plugs 12 of a nearby row or column.

Figure 3D:
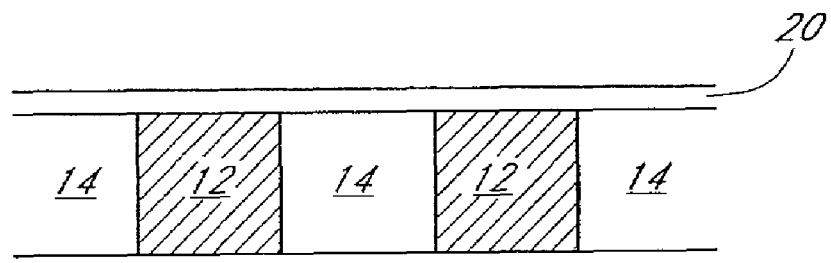

FIGS. 3A-3G illustrate an exemplary process of forming a multi-layer interconnect 10 having an isolation layer 20, in accordance with one embodiment of the present invention. The process begins in substantially the same way as the exemplary fabrication process described above in connection with FIG. 1. For example, as illustrated in FIG. 3A, the insulating layer 14 is deposited as a blanket layer on a substrate (not shown). The insulating layer 14 may comprise any of a wide variety of nonconductive materials, such as, for example, low k materials, TEOS, polyimide, etc.

As illustrated in FIG. 3B, a plurality of vias 24 are formed in the insulating layer 14. The vias 24 are preferably formed using conventional photolithography and etching techniques. For example, in some embodiments, a photoresist film is deposited on the insulating layer 14 and exposed to radiation through a mask. The radiation may comprise a any of a variety of forms of radiation, such as, for example, 248 nm, depending on the selected photoresist material.

In some embodiments, the thickness of the photoresist film preferably falls within the range of about 500 nm to about 1500 nm, more preferably about 980 nm, and it is subjected to a radiation exposure level preferably within the range of 10 $mJ/cm^2$ to about 90 $mJ/cm^2$, more preferably about 35 $mJ/cm^2$ to about 41 $mJ/cm^2$, with an exemplary dose of about 38 $mJ/cm^2$. Following this exposure, the photoresist film is developed and selectively removed in regions to leave a photoresist mask on the surface of the insulating layer 14, and the insulating layer 14 is etched through the mask to form the vias 24 using a suitable etching process, such as, for example, ion milling, reactive ion etching, or chemical etching. Preferably, dry etching techniques are employed in order to produce nearly vertical walls and consequently higher density.

As illustrated in FIG. 3C, a conductive material is deposited over the insulating layer 14 and etched back to form the conductive plugs 12. The conductive plugs 12 may comprise any of a wide variety of materials. Preferably, the conductive plugs 12 comprise adhesion and barrier layers, such as titanium and titanium nitride, lining the vias 24, and the vias 24 are subsequently filled with a CVD metal, such as tungsten. The conductive material can be deposited using any suitable deposition processes, such as, for example, CVD or PVD, and can be etched back using any suitable process, such as, for example, CMP.

As illustrated in FIG. 3D, an isolation layer 20 is formed as a blanket layer over the insulating layer 14 and the conductive plugs 12. In a preferred embodiment, the isolation layer 20 comprises TEOS. In other embodiments, the isolation layer 20 may comprise another nonconductive material, such as, for example, silicon nitride or BPSG. The thickness of the isolation layer 20 preferably falls within the range of about 5 nm to about 100 nm, more preferably within the range of about 10 nm to about 50 nm, and most preferably within the range of about 20 nm to about 30 nm.

Figure 3E:
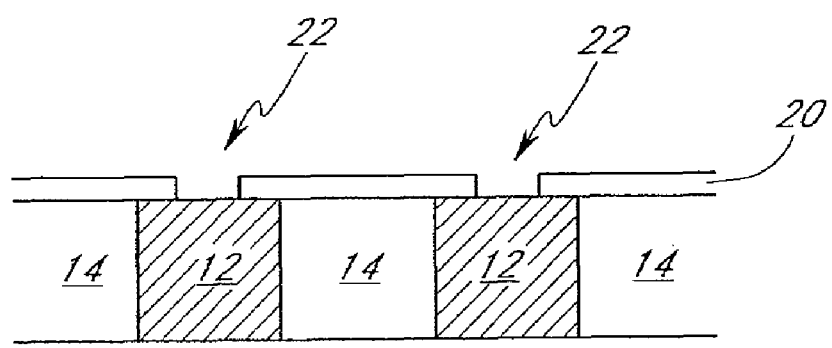

As illustrated in FIG. 3E, a plurality of openings 22 are formed in the isolation layer 20. The openings 22 are preferably formed by depositing a photoresist film on the isolation layer 20 and exposing the film to radiation through the same mask reticle used to form the vias 24 in the insulating layer 14. The thickness of the photoresist film preferably falls within the range of about 100 nm to about 500 nm, more preferably about 300 nm. For a positive resist, the radiation exposure level is less than the exposure level used to form the vias 24 in the insulating layer 14, preferably more than 5% less and more preferably 10-15% less. Thus, if an exposure level of 38 mJ/cm$^2$ is used to form the vias 24, then the photoresist film over the isolation layer 20 is preferably subjected to an exposure level within the range of about 32.3 mJ/cm$^2$ to about 34.2 mJ/cm$^2$.

Following this exposure, the exposed portions of the positive photoresist film are selectively removed to form a photoresist mask on the surface of the isolation layer 20, and the isolation layer 20 is etched to form the openings 22 using a suitable etching process, such as, for example, ion milling, reactive ion etching, or chemical etching. If an etching process involving a chemical etchant is selected, any of a variety of well-known etchants can be used, such as, for example, $CHF_3$ or $CF_4$.

Note that, while the example is given for a positive photoresist film, the same result can be accomplished using a negative photoresist film in which the non-exposed portions of the film are selectively removed. In this case, the first mask defining the first vias 24 for the contact plugs 12 are defined using a lower exposure level than the second mask that defines the second vias 22. Preferably the first photolithography mask employs a more than 5% lower dose, more preferably 10-15% lower dose, than the dose used by the second mask.

Preferably, the second exposure (with a dose defining a narrower opening) preferably also employs a thinner photoresist mask. For example, mask to define the plug vias can be about 9800 Å in thickness, whereas the photoresist layer defining the openings 22 in the isolation layer 20 can be about 3000 Å. More generally, the second use of the mask preferably employs a photoresist layer less than 50% of the first photoresist layer that uses the same mask pattern, more preferably less than about 35% of the prior mask thickness.

Using the same mask to form the openings 22 in the isolation layer 20 and the vias 24 in the insulating layer 14 presents a number of advantages. For example, because no additional mask is required to form the openings 22 in the isolation layer 20, the additional cost associated with forming openings 22 is relatively low. Moreover, because the same mask is used, aligning the mask over the conductive plugs 12 is fairly straightforward.

Figure 3F:
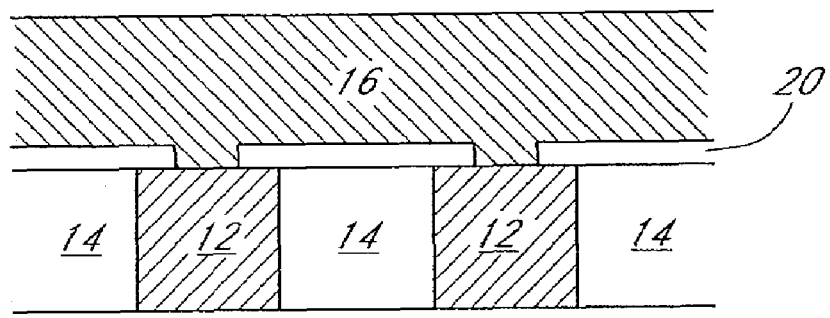

As illustrated in FIG. 3F, the material used to form the conductive lines 16 is deposited as a blanket layer over the isolation layer 20 and the conductive plugs 12. The conductive lines 16 may comprise any of a wide variety of materials, preferably metallic materials such as, for example, aluminum or copper. In the illustrated embodiment, however, the conductive lines are blanket deposited and dry etched and so preferably comprise a conventional IC metal, such as aluminum and alloys thereof. The conductive material can be deposited using any suitable deposition processes, such as, for example, PVD or CVD. In some embodiments, the thickness of the layer of conductive material preferably falls within the range of about 250 nm to about 350 nm, more preferably about 290 nm to 310 nm. Optionally, the conductive lines 16 also include a lower titanium glue layer (e.g., 80 Å-120 Å) and an upper TiN antireflective coating (ARC).

Figure 3G:
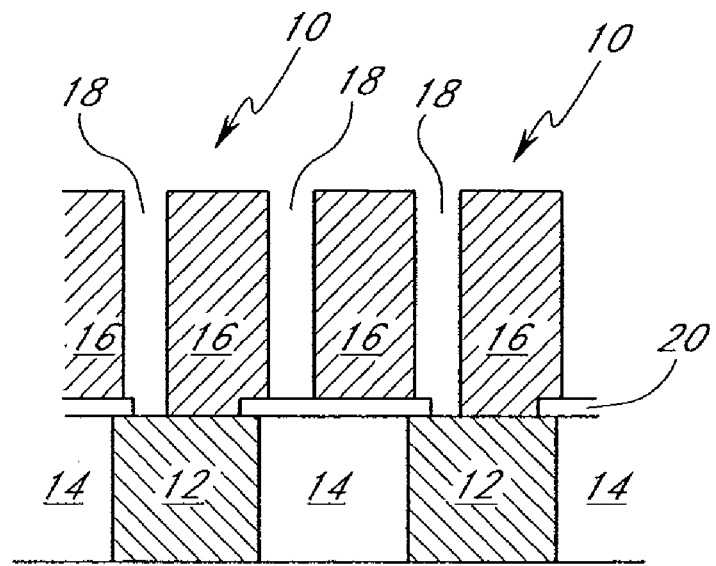

As illustrated in FIG. 3G, a series of openings or trenches 18 are formed using conventional photolithography and etching techniques to pattern the conductive lines 16. For example, in some embodiments, a photoresist film is deposited on layer of conductive material and exposed to radiation through a mask. In some embodiments, the thickness of the photoresist film preferably falls within the range of about 25 nm to about 100 nm, more preferably about 36 nm, and the width of the trenches is selected to leave a width of the metal lines 16 at between about 5 nm and 1000 nm, more preferably between about 100 nm and 120 nm. Following this exposure, the exposed portions of the photoresist film (if using a positive resist) are selectively removed to form a photoresist mask on the surface of the conductive layer 14, and the conductive layer 14 is etched to form the trenches 18 using a suitable etching process, such as, for example, ion milling, reactive ion etching, or chemical etching. Preferably, a dry etch process is employed to produce vertical sidewalls and maximize density. Note that this second mask defines lines having a different pattern than the mask that defined both the underlying contact plugs 12 and the smaller openings 22 above it.

Figure 3H:
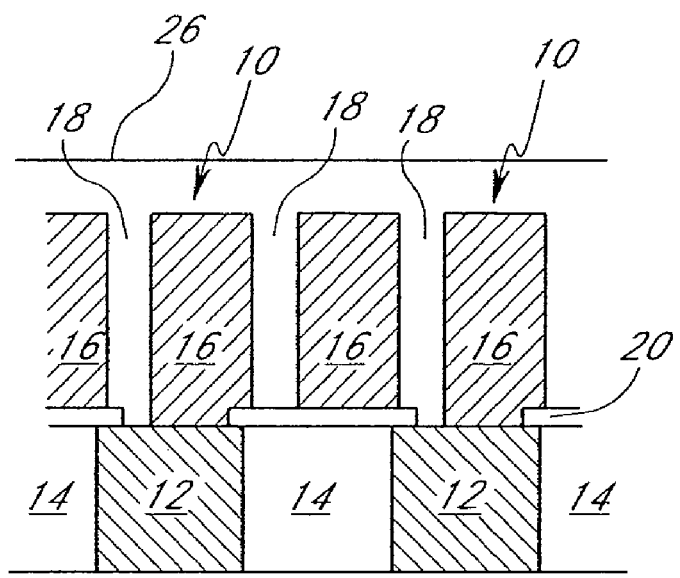

As illustrated in FIG. 3H, the gaps or openings 18 between the metal lines 16 are then filled, such as by deposition of an insulating material 26, followed by etch back or polishing. While not shown, the insulating material 26 can be polished back to the level of the conductive lines 16. Any suitable insulating layer conventionally employed for an inter-level dielectrics (ILD), such as TEOS and other forms of oxide, polyimide, carbon-doped oxides and other low k materials, etc., can serve as the insulating material 26. The insulating material 26 can comprise the same material as layer 20, but will nevertheless be recognized as a separate layer in the final product by the presence of the isolation layer 20 underneath the metal lines 16, and its presence vertically between conductive plugs 12 and the overlying metal lines 16 except at the openings 22 (see FIG. 3E). Note that, although illustrated as smaller than the width of the lines 16, the openings 22 can be arranged by selection of the radiation dose used to define the openings 22 to have a similar width to that of the conductive lines 16.

Because the openings 22 are formed in the isolation layer 20 using the same mask at a different exposure level than that used to form the vias 24 in the insulating layer 14, the openings 22 have a narrower width than that of the underlying conductive plugs 12. Therefore, the isolation layer 20 and the openings 22 effectively reduce the width of the exposed conductive surface area at the top of the conductive plugs 12. By reducing this exposed conductive surface area, the likelihood of an undesired electrical short forming between a conductive line 16 and a conductive plug 12 due to mask misalignment is advantageously reduced.

In the embodiment illustrated in FIG. 3H, for example, even though the trenches 18 are slightly misaligned, the isolation layer 20 electrically insulates the conductive lines 16 from the conductive plugs 12 of neighboring rows or columns within the array.

The intermediate insulating layer 20 provides a sort of mini-damascene process whereby openings are provided underneath the metal lines 16 only in the openings 22 directly over contact plugs 12. The remaining portions of the intermediate insulating layer 20 serve to elevate the floor of the metal lines 16 above the top level of the contact plugs 12 everywhere except within the openings 22 above the contact plugs 12 themselves. Accordingly, the thickness of the intermediate insulating layer 20 serves as an additional safety or buffer layer vertically separating adjacent metal lines 16 from the underlying contacts 12, such that even a slight mask misalignment in the horizontal dimension has reduced risk of producing a short circuit. As a result, undesired electrical shorting is advantageously inhibited despite the mask misalignment.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

We claim:

1. An integrated circuit comprising:
   a conductive plug having an upper surface, the conductive plug formed in a lower insulating layer and having a first width;
   a first conductive line having a lower portion, the first conductive line formed over the conductive plug; and
   a second conductive line separated from the first conductive line by a length of separation of less than about 110 nm, wherein the first width of the conductive plug is greater than the length of separation between the first conductive line and the second conductive line; and
   an isolation layer formed between the conductive plug and the first and second conductive lines, the isolation layer comprising an opening through which the lower portion of the first conductive line extends to make electrical contact with the upper surface of the conductive plug, the opening having a second width smaller than the first width of the conductive plug, wherein the isolation layer extends over an upper surface of the lower insulating layer between the conductive plug and adjacent conductive plugs in the lower insulating layer and electrically isolates one or more outer regions of the upper surface of the conductive plug from other nearby conductive lines.

2. The integrated circuit of claim 1, wherein the conductive plug comprises tungsten.

3. The integrated circuit of claim 1, wherein the width of the conductive plug is between about 50 nm and about 300 nm.

4. The integrated circuit of claim 1, further comprising an upper insulating layer overlying the isolation layer and between the first conductive line and the second conductive line.

5. The integrated circuit of claim 1, wherein the first conductive line comprises aluminum.

6. The integrated circuit of claim 5, wherein the first conductive line further comprises a titanium layer and a titanium nitride layer.

7. The integrated circuit of claim 1, wherein the first conductive line has a width between about 100 nm and about 120 nm.

8. The integrated circuit of claim 1, wherein the isolation layer comprises Tetraethylorthosilicate (TEOS).

9. The integrated circuit of claim 1, wherein the isolation layer comprises silicon nitride.

10. The integrated circuit of claim 1, wherein the isolation layer has a thickness between about 5 nm and about 100 nm.

11. The integrated circuit of claim 10, wherein the isolation layer has a thickness between about 10 nm and 50 nm.

12. A system including an integrated circuit, comprising:
    a metal plug having a first width embedded in a lower insulating layer;
    a dielectric layer having a thickness between about 5 nm and about 100 nm, wherein the dielectric layer extends over an upper surface of the lower insulating layer between the conductive plug and adjacent conductive plugs in the lower insulating layer and comprises an opening formed over the metal plug; and
    a pair of metal lines in contact with the dielectric layer, the metal lines being separated from each other by a length of separation of less than about 110 nm, wherein one of the metal lines has a lower portion that extends through the opening to make electrical contact with the metal plug, and wherein the first width of the metal plug is greater than the length of separation between the pair of metal lines.

13. The system of claim 12, wherein the metal plug comprises tungsten.

14. The system of claim 12, wherein the dielectric layer has a thickness between about 10 nm and 50 nm.

15. The system of claim 12, wherein the dielectric layer has a thickness between about 20 nm and 30 nm.

16. The system of claim 12, wherein the metal lines comprise aluminum.

17. The system of claim 12, wherein the dielectric layer comprises Tetraethylorthosilicate (TEOS).

18. The system of claim 12, wherein the dielectric layer comprises silicon nitride or Borophosphosilicate glass (BPSG).

19. A metallization scheme for an integrated circuit, comprising:
    a plurality of metal plugs at a first level; and
    a plurality of metal lines formed above the plurality of metal plugs at a second level, wherein the metal lines are vertically separated from the metal plugs by a distance between about 5 nm and 100 nm except at positions directly over the metal plugs, and the metal lines are horizontally separated from each other by a length of separation of less than about 110 nm, wherein each of the metal plugs has a width that is greater than the length of separation between a metal line in contact with the metal plug and an adjacent metal line.

20. The metallization scheme of claim 19, wherein the metal lines include integral lower extensions at the positions over the metal plugs.

21. The metallization scheme of claim 20, wherein the integral lower extensions have a width smaller than a width of the metal plugs.

* * * * *